(12) United States Patent
Nishiba

(10) Patent No.: US 8,047,231 B2
(45) Date of Patent: Nov. 1, 2011

(54) VALVE ELEMENT UNIT AND GATE VALVE APPARATUS

(75) Inventor: Takehiro Nishiba, Shizuoka (JP)

(73) Assignee: Nippon Val-Qua Industries, Ltd., Tokyo (JP)

( * ) Notice: Subject to any disclaimer, the term of this patent is extended or adjusted under 35 U.S.C. 154(b) by 418 days.

(21) Appl. No.: 12/227,979

(22) PCT Filed: Jun. 18, 2007

(86) PCT No.: PCT/JP2007/062249
§ 371 (c)(1),
(2), (4) Date: Dec. 4, 2008

(87) PCT Pub. No.: WO2007/148657
PCT Pub. Date: Dec. 27, 2007

(65) Prior Publication Data
US 2009/0108226 A1    Apr. 30, 2009

(30) Foreign Application Priority Data
Jun. 19, 2006    (JP) .................................. 2006-168767

(51) Int. Cl.
*F16K 11/04* (2006.01)
*C23C 14/56* (2006.01)

(52) U.S. Cl. .................... 137/625.46; 414/221; 118/733

(58) Field of Classification Search ................ 137/625, 137/625.46; 118/715, 733; 414/217.1, 221
See application file for complete search history.

(56) References Cited

U.S. PATENT DOCUMENTS 6,045,620 A * 4/2000 Tepman et al. ............... 118/733
7,192,487 B2 * 3/2007 Carpenter et al. ........... 118/715
7,214,274 B2 * 5/2007 Wallace et al. ............... 118/719
7,282,097 B2 * 10/2007 Tanase et al. ................. 118/733
7,637,477 B2 * 12/2009 Hiroki ........................... 251/163

FOREIGN PATENT DOCUMENTS

| JP | S46-14779 | 4/1971 |
| JP | 05-306779 | 11/1993 |
| JP | 08-060374 | 3/1996 |
| JP | 10-196806 | 7/1998 |
| JP | 2001-082613 | 3/2001 |
| JP | 2002-536597 | 10/2002 |
| JP | 2004-076893 | 3/2004 |
| JP | 2006-057816 | 3/2006 |
| JP | 2006-170373 | 6/2006 |

* cited by examiner

*Primary Examiner* — John Fox
(74) *Attorney, Agent, or Firm* — Kubotera & Associates, LLC

(57) ABSTRACT

To provide a valve element unit and a gate valve apparatus which realize a reduction in manufacturing cost by a compact and simple structure and smooth rotary driving of the valve element without greatly moving the valve element in the direction of the center of rotation when the valve element is rotary driven.

When a valve element unit 52 is rotary driven by valve element driving mechanisms 54, a rotary drive radius R2 of longitudinal both end sides of a first valve element 56 is smaller than a rotary drive radius R1 of a longitudinal center side of the first valve element 56. Therefore, even when a sidewall is formed on a longitudinal outer side of a transfer port 46 of a casing 44, part of the valve element unit 52 does not come into contact (interfere) with the sidewall, which makes it possible to rotary drive the valve element unit 52 only by slightly moving the valve element unit 52 in a direction of the center of rotation, without greatly moving the valve element unit 52 in the direction of the center of rotation at the time of the rotary driving.

7 Claims, 17 Drawing Sheets

VALVE ELEMENT UNIT AND GATE VALVE APPARATUS

TECHNICAL FIELD

The present invention relates to a valve element unit and a gate valve apparatus used in a process chamber where a predetermined process is applied to an object to be processed such as a semiconductor wafer.

BACKGROUND ART

Generally, in a manufacturing process of a semiconductor device, various kinds of processes such as, for example, dry etching, sputtering, and CVD (Chemical Vapor Deposition) are repeatedly applied to a semiconductor wafer. Many of the above various processes are performed under a vacuum atmosphere, and load openings through which the wafer is loaded/unloaded into/from process chambers for these kinds of processes are sealed by gate valve apparatuses in a highly airtight state during the processes.

A gate valve apparatus of this type is, for example, mounted on a load opening which is formed on a sidewall of an evacuatable process chamber and has a narrow width large enough to allow the passage of the wafer. During the process, the process is performed in a state where the load opening is airtightly closed by a valve element, which is provided with an O-ring or the like, of the gate valve apparatus.

Here, as shown in FIG. 15 and FIG. 16, a conventional gate valve apparatus 100 has a casing 102, a valve element 104 drivably provided in the casing 102, and a valve element driving unit 106 which rotary drives the valve element 104 and thereafter presses the valve element 104 toward a valve seat. Further, in the casing 102, formed are a first opening 108 through which the casing 102 communicates with an adjacent process chamber (not shown) and a second opening 110 through which the maintenance of a later-described sealing member 112 provided in the valve element 104 is performed. The valve element 104 is capable of closing the first opening 108 or the second opening 110 when rotary driven and pressed toward the valve seat by the valve element driving unit 106. On a front surface of the valve element 104, there are provided the sealing member 112 for airtightly sealing the first opening 108 when the valve element 104 closes the first opening 108 and a sealing member 114 for airtightly sealing the second opening 110 when the valve element 104 closes the second opening 110.

The above-described structure has a problem, as shown in FIG. 17, that portions, of the valve element 104, close to its longitudinal both ends come into contact with sidewalls of the casing 102 (see a portion S shown in FIG. 17) when the valve element 104 closes the first opening 108 after the valve element 104 closes the second opening 110 during the maintenance of the sealing member 112 and then the maintenance is finished, which necessitates increasing the size of the casing or greatly moving the valve element 104 in a direction of the center of rotation before rotary driving the valve element 104. Greatly moving the valve element 104 in the direction of the center of rotation results in a decrease in a rotary drive radius r of the valve element 104, which can solve the problem of the contact (interference) of part of the valve element 104 with the sidewall of the casing 102.

Patent document 1: Japanese Patent Application Laid-open No. Hei 8-60374

DISCLOSURE OF THE INVENTION

Problems to be Solved by the Invention

However, greatly moving the valve element in the direction of the center of rotation had a problem that the structure of the valve element driving unit accordingly becomes complicated and larger. Further, making the valve element driving unit complicated and larger had a problem that in accordance with this increase in size, manufacturing cost of the gate valve apparatus also increases.

Therefore, considering the above circumstances, it is an object of the present invention to provide a valve element unit and a gate valve apparatus which realize a reduction in manufacturing cost by a compact and simple structure and smooth rotary driving of the valve element without greatly moving the valve element in the direction of the center of rotation at the time of the rotary driving.

Means for Solving the Problems

An invention according to a first aspect is a valve element unit which is provided in a casing having a first opening formed in one sidewall thereof and a second opening formed in another sidewall thereof so as to have an opening area larger than an opening area of the first opening and so as to have a longitudinal length longer than a longitudinal length of the first opening, and which closes or opens the first opening and the second opening, the first opening having longitudinal both ends formed in an arc shape, and the second opening being formed in a manner that a length, of longitudinal both ends of the second opening, in a direction perpendicular to a second opening longitudinal direction is shorter than a length, of a longitudinal center portion of the second opening, in the direction perpendicular to the second opening longitudinal direction, and the valve element unit including: a first valve element formed substantially in the same shape as a shape of the first opening and closing the first opening; and a second valve element formed substantially in the same shape as a shape of the second opening and closing the second opening, wherein a first sealing member airtightly sealing the first opening is fit in the first valve element and a second sealing member airtightly sealing the second opening is fit in the second valve element.

An invention according to a second aspect is the valve element unit according to the first aspect, wherein the first valve element is separable from the second valve element along a plane in a direction perpendicular to a thickness direction of the valve element unit, and the first valve element is attachable/detachable to/from the second valve element when the second valve element is in a state of closing the second opening.

An invention according to a third aspect is the valve element unit according to the second aspect, further including a buffer member provided between the first valve element and the second valve element.

An invention according to a fourth aspect is the valve element unit according to the second or third aspect, further including a positioning member provided between the first valve element and the second valve element to position the first valve element relative to the second valve element.

An invention according to a fifth aspect is a gate valve apparatus including: the valve element unit according to any one of the first to fourth aspects; and a valve element driving unit rotary driving the valve element unit around a predetermined rotation axis.

Effect of the Invention

In the invention according to the first aspect, during the maintenance of the first sealing member, the second valve element included in the valve element unit is in the state of closing the second opening. In this state, the second opening is airtightly sealed by the second sealing member provided in the second valve element, so that the inside of the casing is shut off from the outside. Further, since the first sealing member is exposed from the second opening to the outside, the maintenance is finished by replacing the exposed first sealing member with a new one. After the maintenance is finished, the first valve element of the valve element unit closes the first opening.

Here, the first opening has the longitudinal both ends formed in the arc shape, and the first valve element closing the first opening is formed substantially in the same shape as the shape of the first opening; therefore, longitudinal both ends of the first valve element are naturally in the arc shape. In other words, a length, of the longitudinal both ends of the first valve element, in a direction perpendicular to a first valve element longitudinal direction is shorter than a length, of a longitudinal center portion of the first valve element, in the direction perpendicular to the first valve element longitudinal direction. Further, the length, of the longitudinal both ends of the second opening, in the direction perpendicular to the second opening longitudinal direction, is shorter than the length, of the longitudinal center portion of the second opening, in the direction perpendicular to the second opening longitudinal direction, and the second valve element closing the second opening is formed substantially in the same shape as the shape of the second opening; therefore, a length, of longitudinal both ends of the second valve element, in a direction perpendicular to a second valve element longitudinal direction is shorter than a length, of a longitudinal center portion of the second valve element, in the direction perpendicular to the second valve element longitudinal direction. For these reasons, when the valve element unit is rotated, a rotary drive radius of the longitudinal both ends of the valve element unit becomes shorter than a rotary drive radius of its longitudinal center portion. Therefore, even when a sidewall is formed on a longitudinal outer side of the first opening of the casing, the valve element unit does not come into contact (interfere) with the sidewall, which allows the valve element unit to be rotary driven as it is without greatly moving the valve element unit in the direction of the center of rotation at the time of the rotary driving. This as a result allows the valve element unit and the casing to have a compact and simple structure, enabling a reduction in manufacturing cost thereof.

In the invention according to the second aspect, when the second valve element is in the state of closing the second opening, the first valve element is separable from the second valve element along the plane (cross sectional plane) in the direction perpendicular to the thickness direction of the valve element unit and is attachable/detachable to/from the second valve element; therefore, it is possible to take out the first valve element via the second opening by separating the first valve element from the second valve element when the second valve element is in the state of closing the second opening. Therefore, at the time of the maintenance (replacement) of the deteriorated first sealing member, it is possible to replace the deteriorated first sealing member with a new first sealing member only by detaching the first valve element from the second valve element and fitting another new first valve element (a first valve element with a proper first sealing member fit therein) on the second valve element. In this manner, when the first sealing member is replaced with the new first sealing member, replacing the whole first valve element can save the trouble of fitting the first sealing member in the first valve element. As a result, a work of replacing the first sealing member can be made simple and easy, enabling improved work efficiency.

Further, when the first sealing member is replaced, the first valve element is also replaced with a new one; therefore, even when a reaction product (dust and the like) which may cause the generation of particles adheres on a surface of the first valve element in which the deteriorated first sealing member is fit, it is possible to always keep the surface of the first valve element clean by cleaning the surface of the first valve element (or replacing the first valve element with a new first valve element) at the time of the replacement of the first sealing member. As a result, it is possible to prevent the generation of particles.

In the invention according to the third aspect, the buffer member is interposed between the first valve element and the second valve element, which can prevent the generation of dust such as iron powder (metal powder) ascribable to the friction between the first valve element and the second valve element. As a result, dust which may cause particles is prevented from being generated in the casing.

In the invention according to the fourth aspect, the positioning member for positioning the first valve element relative to the second valve element is provided between the first valve element and the second valve element, which can prevent the displacement of the first valve element relative to the second valve element. Especially, the work of mounting the first valve element on the second valve element can be made simple and easy because the positioning of the first valve element relative to the second valve element is enabled by the positioning member when the first valve element is mounted on the second valve element.

In the invention according to the fifth aspect, it is possible to rotary drive the valve element unit by the valve element driving unit 52 as it is without greatly moving the valve element unit in the direction of the center of rotation at the time of the rotary driving. This allows the gate valve apparatus to have a compact and simple structure, enabling a reduction in manufacturing cost thereof.

Figure 1:
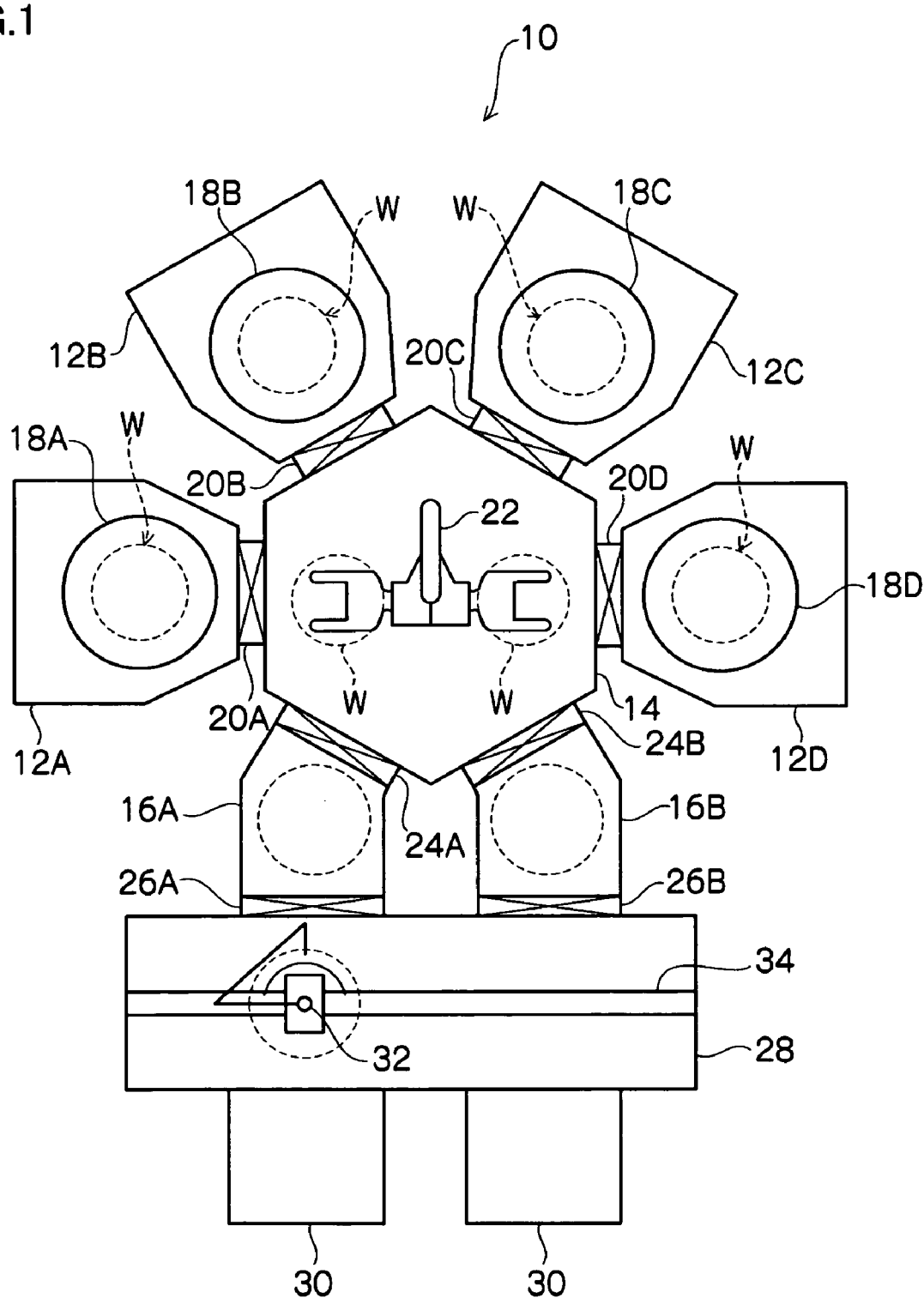
FIG. 1 is a plane view showing an example of a processing system using a gate valve apparatus according to a first embodiment of the present invention.

EXPLANATION OF CODES 11 gate valve apparatus
13 valve element unit
15 first valve element
17 second valve element
12A, 12B, 12C, 12D process chamber
20A, 20B, 20C, 20D gate valve apparatus
27 first sealing groove (groove)
29 valve element sealing part (first sealing member)
31 positioning pin (positioning member)
38 load opening (chamber-side opening)
39 maintenance sealing part (second sealing member)
43 buffer sheet (buffer member)
44 casing
46 transfer port (first opening)
52 valve element unit
54 valve element driving mechanism (valve element driving unit)
56 first valve element
57 second valve element
58 valve element sealing part (first sealing member)
60 maintenance sealing part (second sealing member)
62 maintenance port (second opening)
W semiconductor wafer (object to be processed)

BEST MODE FOR CARRYING OUT THE INVENTION

Next, a gate valve apparatus according to a first embodiment of the present invention will be described with reference to the drawings.

As shown in FIG. 1, a processing system 10 has a plurality of (four) process chambers 12A, 12B, 12C, 12D, a hexagonal transfer chamber 14 communicatable with all of the process chambers 12A, 12B, 12C, 12D, and two load-lock chambers 16A, 16B. Concretely, the process chambers 12A, 12B, 12C, 12D are individually evacuatable and have therein setting tables 18A, 18B, 18C, 18D, respectively, on which a semiconductor wafer (hereinafter, referred to as a wafer when appropriate) as an object to be processed is set, and various kinds of processes are applied to the wafer W set on the setting tables 18A, 18B, 18C, 18D. The various kinds of processes are generally performed under a vacuum atmosphere, but are sometimes performed under a substantially normal pressure depending on the form of the processes. The process chambers 12A, 12B, 12C, 12D are joined to sides of the transfer chamber 14 via gate valve apparatuses 20A, 20B, 20C, 20D according to the present invention respectively.

Further, the inside of the transfer chamber 14 is also evacuatable and returnable to the atmospheric pressure. In the transfer chamber 14, a transfer mechanism 22 which is bendable/stretchable and turnable so as to carry the wafer W is provided, so that the wafer W can be carried into/out of an opened one of the process chambers 12A, 12B, 12C, 12D.

Further, the two load-lock chambers 16A, 16B are coupled to the transfer chamber 14 via gate valve apparatuses 24A, 24B. The inside of each of the load-lock chambers 16A, 16B is also evacuatable and returnable to the atmospheric pressure. Further, the load-lock chambers 16A, 16B are connected to a loader module 28 via gate valve apparatuses 26A, 26B respectively. On the loader module 28, ports 30 for the installation of cassettes each housing a plurality of the wafers W are provided. In the loader module 28, a transfer arm mechanism 32 which is bendable/stretchable and turnable is provided to be movable along a guide rail 34, so that the wafer W can be taken in from the inside of each of the cassettes set on the ports 30 to be carried into each of the load-lock chambers 16A, 16B. Further, the wafer W in the load-lock chambers 16A, 16B is taken in by the transfer mechanism 22 in the transfer chamber 14 to be carried into each of the process chambers 12A, 12B, 12C, 12D as described above. Further, to unload the wafer W, the wafer W is carried out through a route reverse to the aforesaid loading route.

Next, the gate valve apparatuses 20A, 20B, 20C, 20D of the present invention provided between the transfer chamber 14 and the process chambers 12A, 12B, 12C, 12D respectively will be described with reference to FIG. 2. Since these gate valve apparatuses 20A, 20B, 20C, 20D have the same structure, FIG. 2 shows a gate valve apparatus 20 representing the gate valve apparatuses 20A, 20B, 20C, 20D, and shows a process chamber 12 representing the process chambers 12A, 12B, 12C, 12D.

Figure 2:
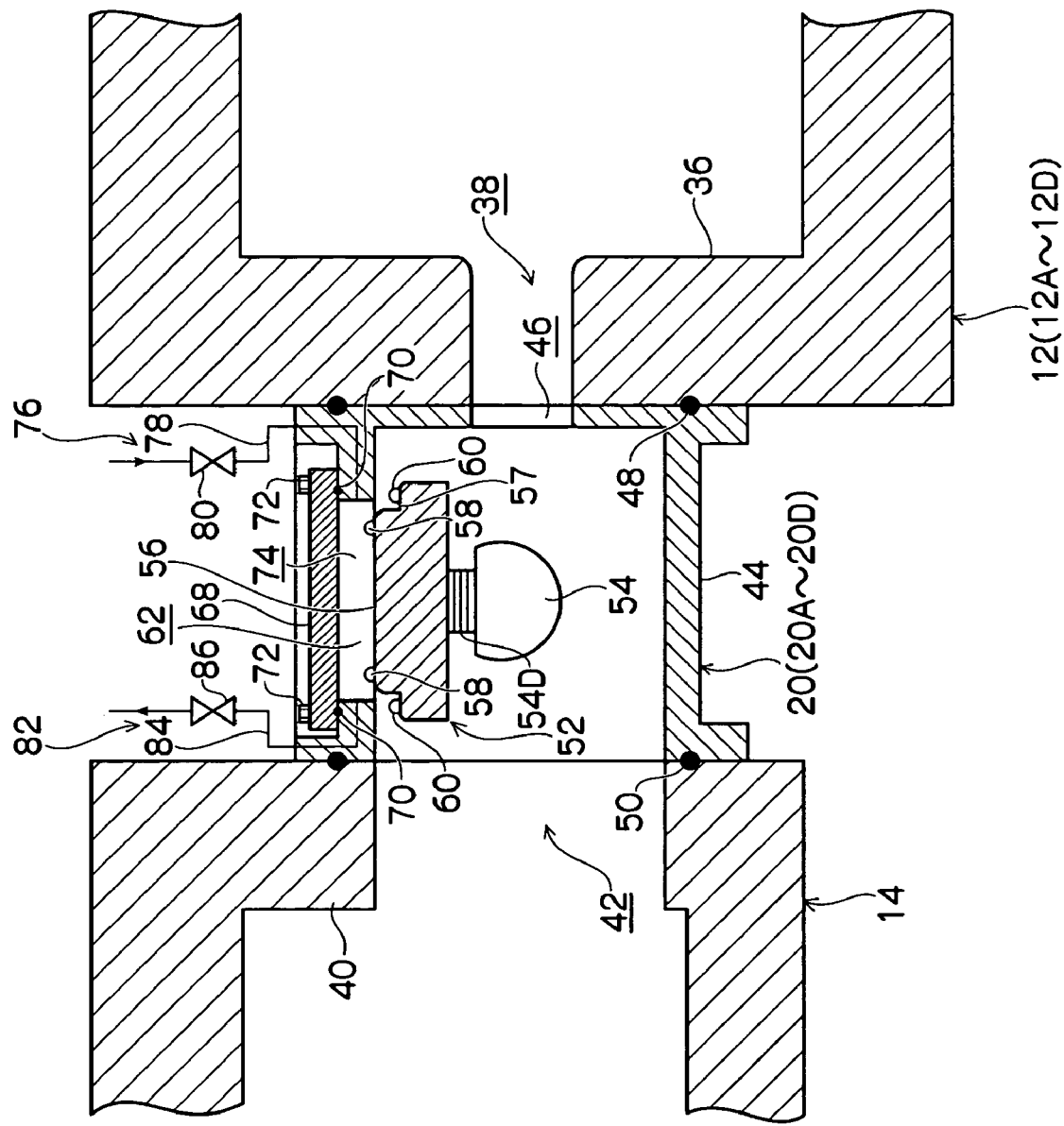
FIG. 2 is an enlarged cross-sectional view showing a state where the gate valve apparatus according to the first embodiment of the present invention is mounted.

As shown in FIG. 1 and FIG. 2, in a sidewall 36 defining the process chamber 12, a slender load opening 38 through which the wafer W is passed to be loaded/unloaded is formed, and an opening 42 is formed also in a sidewall 40 defining the transfer chamber 14. The gate valve apparatus 20 has a casing 44 in a substantially rectangular parallelepiped shape made of, for example aluminum. On one side of the casing 44, a slender transfer port (first opening) 46 communicating with the inside of the process chamber 12 is formed. On joint surfaces of the casing 44 joined to the process chamber 12 and the transfer chamber 14, O-rings 48, 50 are interposed respectively, so that airtightness can be maintained.

Here, the shape of the transfer port 46 which is an essential part of the present invention will be described in detail.

Figure 7:
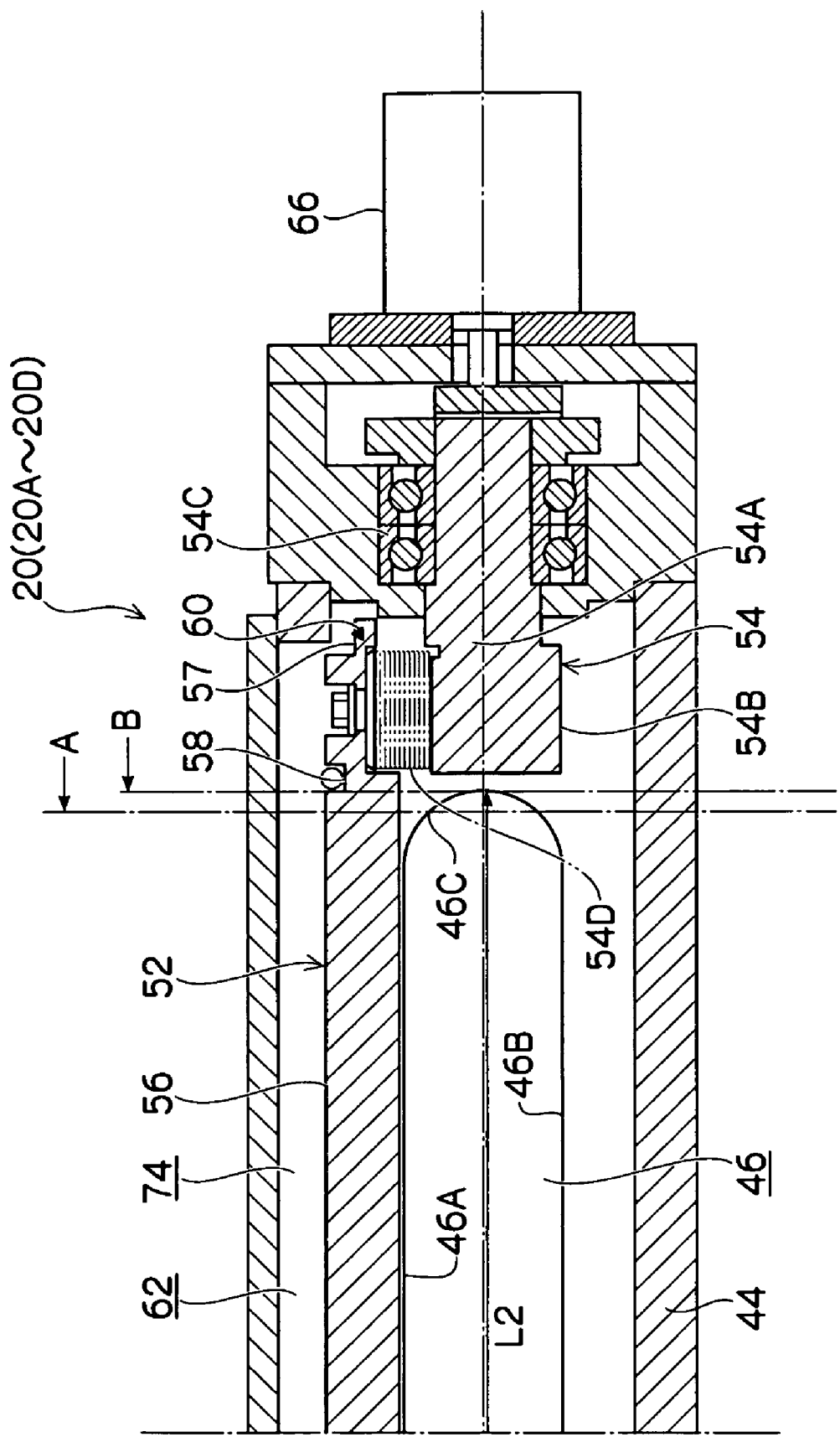
FIG. 7 is a partial cross-sectional view showing the gate valve apparatus according to the first embodiment of the present invention.

As shown in FIG. 7, the transfer port 46 is formed substantially in the same shape as the shape of the load opening 38.

Concretely, in the casing 44, a first extension portion 46A defining and forming the transfer port 46 is formed. In the casing 44, a second extension portion 46B defining and forming the transfer port 46 is further formed. In the casing 44, a first curved portion 46C connecting one extension-direction end of the first extension portion 46A and one extension-direction end of the second extension portion 46B is further formed. In the casing 44, a second curved portion (not shown) connecting the other extension-direction end of the first extension portion 46A and the other extension-direction end of the second extension portion 46B is further formed. Each of the curved portions 46C is formed in an arc shape whose diameter with respect to a center point is constant. Thus, the transfer port 46 is formed so as to be surrounded by the extension portions 46A, 46B and the curved portions 46C formed in the casing 44.

In the casing 44, a valve element unit 52 and valve element driving mechanisms 54 driving the valve element unit 52 are further provided, and the valve element unit 52 is capable of airtightly sealing the transfer port 46 when necessary. Since the transfer port 46 and the load opening 38 integrally communicate with each other, the load opening 38 is also opened/closed when the transfer port 46 is opened/closed.

Figure 4:
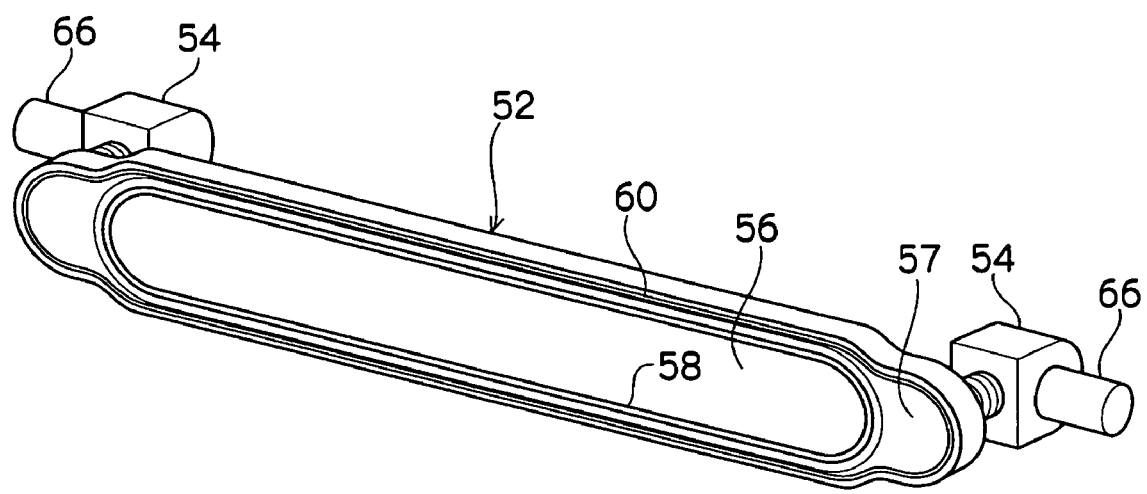
FIG. 4 is a perspective view of a valve element unit included in the gate valve apparatus according to the first embodiment of the present invention.
Figure 5:
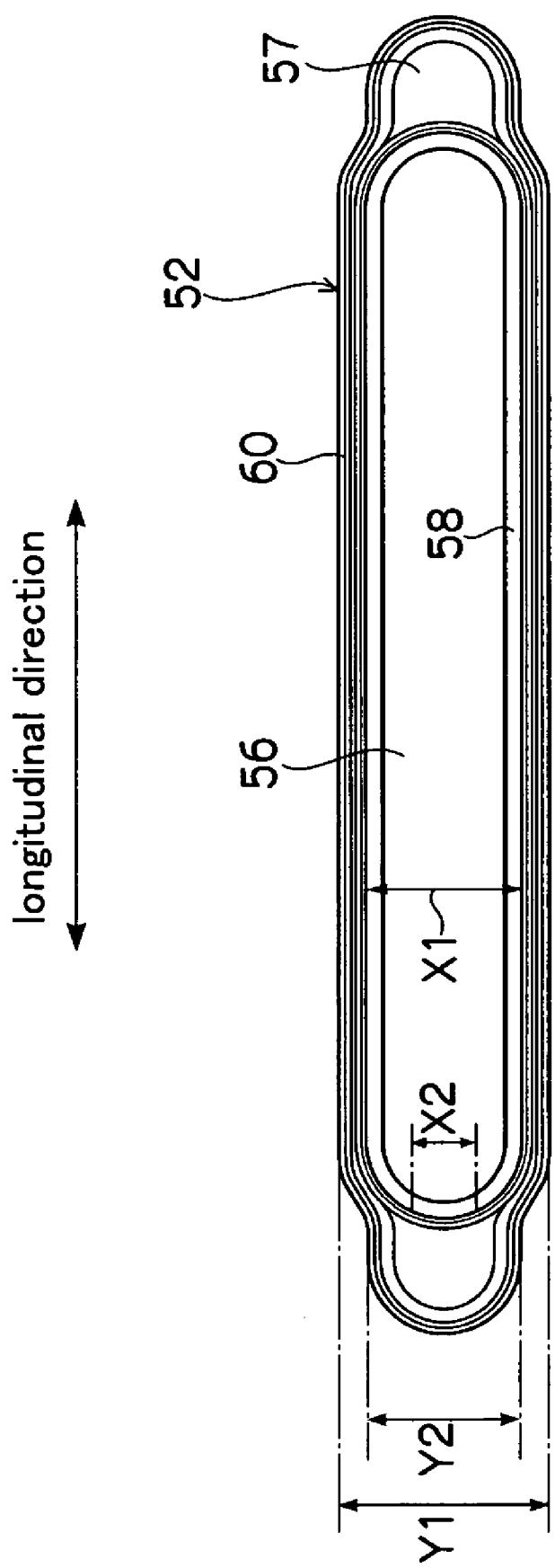
FIG. 5 is a front view of the valve element unit included in the gate valve apparatus according to the first embodiment of the present invention.

Concretely, as shown in FIG. 4 and FIG. 5, the valve element unit 52 includes a first valve element 56 in a flat plate shape closing or opening the transfer port 46 and a second valve element 57 in a flat plate shape closing or opening a later-described maintenance port (second opening) 62 (see FIG. 6). In the first valve element 56, a valve element sealing part (first sealing member) 58 is provided which airtightly seals the transfer port 46 when the valve element unit 52 closes the transfer port 46. Further, in the second valve element 57, a maintenance sealing part (second sealing member) 60 is provided which is positioned outside the valve element sealing part 58 and airtightly seals the maintenance port 62 when the valve element unit 52 closes the maintenance port 62. Preferably, the valve element sealing part 58 and the maintenance sealing part 60 are formed by O-rings.

Here, the shapes and structures of the first valve element 56, the second valve element 57, and the sealing parts 58, 60 which are essential parts of the present invention will be described in detail.

As shown in FIG. 4 and FIG. 5, the first valve element 56 of the valve element unit 52 is formed substantially in the same shape as the shape of the transfer port 46 and has longitudinal both ends formed in an arc shape. The aforesaid valve element sealing part 58 is fit in a periphery of the first valve element 56. Further, the second valve element 57 of the valve element unit 52 is formed substantially in the same shape as the shape of the maintenance port 62, and a length Y2, of valve element longitudinal both ends of the second valve element 57, in a direction perpendicular to the valve element longitudinal direction is set shorter than a length Y1, of a valve element longitudinal center portion of the second valve element 57, in the direction perpendicular to the valve element longitudinal direction. Outer contours of the valve element longitudinal both ends of the second valve element 57 are formed in a curved shape. The maintenance sealing part 60 is fit in a periphery of the second valve element 57.

Further, as shown in FIG. 4 and FIG. 7, near the longitudinal both ends of the valve element unit 52, the valve element driving mechanisms 54 driving the valve element unit 52 relative to the casing 44 are mounted. The valve element driving mechanisms 54 are connected to driving sources 66 such as motors, and powered by the driving sources 66, the valve element driving mechanisms 54 rotary drive the valve element unit 52 around a predetermined rotation axis. The valve element driving mechanisms 54 move the valve element unit 52 between the transfer port 46 and the maintenance port 62 and also drive the valve element unit 52 so that the valve element unit 52 is seated on a seating surface around the transfer port 46 or the maintenance port 62.

For example, as shown in FIG. 7, the valve element driving mechanisms 54 are each made up of a shaft 54A provided to be pivotable on a means such as a bearing 54C relative to the casing 44, a support 54B supporting the valve element unit 52 and drivable in a substantially perpendicular direction to the shaft 54A. Around the support 54B, an expansion member 54D which is contractible/expandable is provided.

Figure 6:
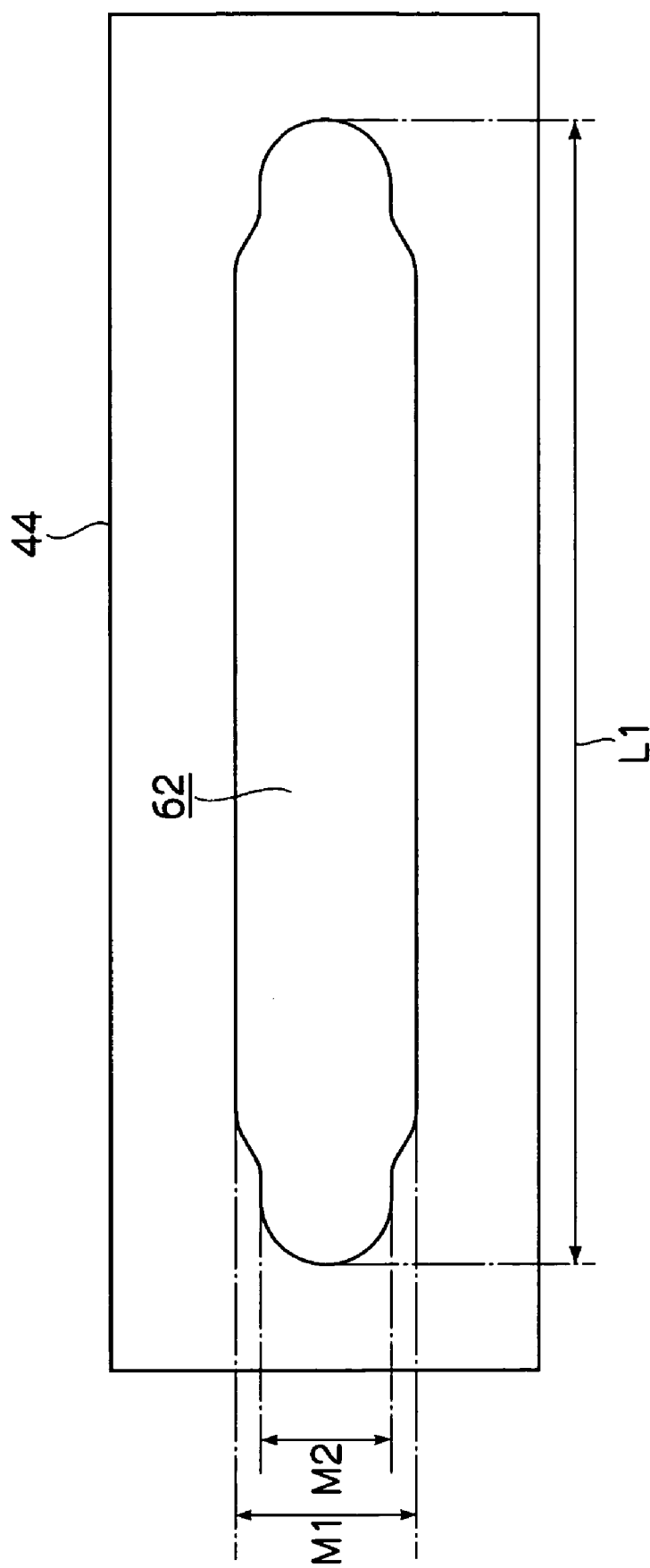
FIG. 6 is a view showing a maintenance port formed in a casing included in the gate valve apparatus according to the first embodiment of the present invention.

Further, as shown in FIG. 6, in a ceiling of the casing 44, the slender maintenance port 62 through which the valve element sealing part 58 is replaced is formed. Concretely, the size of the maintenance port 62 is set so that, when the valve element unit 52 is seated on the seating surface around the maintenance port 62, the maintenance sealing part 60 on the outer side is in contact with the seating surface to ensure airtight sealing while only the valve element sealing part 58 on the inner side is exposed. In other words, the maintenance port 62 is formed to be slightly larger in width than the transfer port 46, and thus the maintenance port 62 is airtightly sealed by the maintenance sealing part 60, while the valve element sealing part 58 on the inner side is exposed in the maintenance port 62.

Here, the shape of the maintenance port 62 which is an essential part of the present invention will be described in detail.

As shown in FIG. 6 and FIG. 7, the maintenance port 62 is formed to have an opening area larger than an opening area of the transfer port 46. Further, a longitudinal length L1 of the maintenance port 62 is set longer than a longitudinal length L2 of the transfer port 46.

Figure 3:
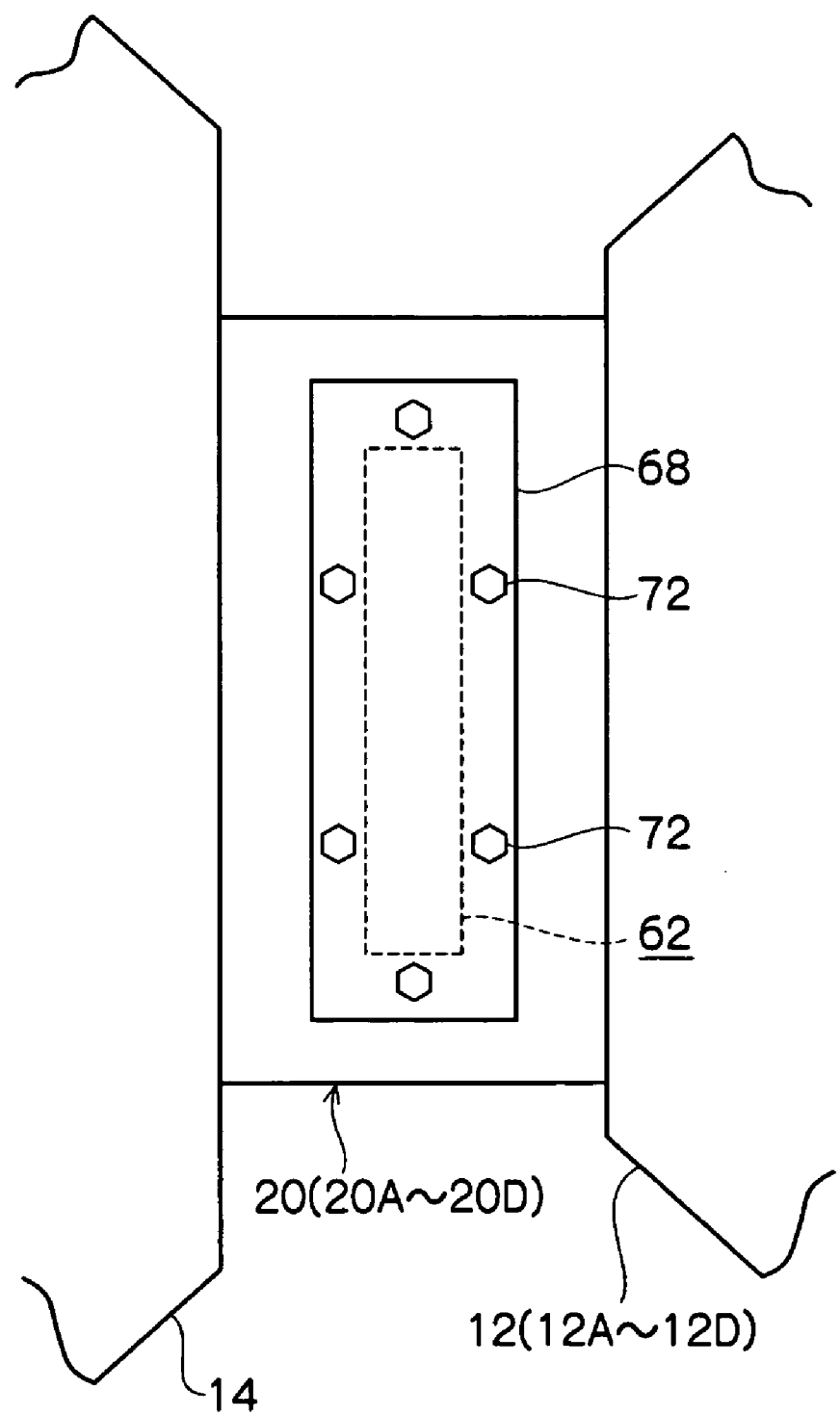
FIG. 3 is a top view of the gate valve apparatus according to the first embodiment of the present invention.

Further, as shown in FIG. 2 and FIG. 3, on an outer side of the maintenance port 62, a maintenance cover 68 is airtightly mounted via an O-ring 70. In this case, the maintenance cover 68 is attachably/detachably mounted by a plurality of bolts 72. Further, using, for example, a transparent plate made of acrylic resin or the like as the maintenance cover 68 makes it possible to visually check a deterioration degree of the valve element sealing part 58 from the outside without detaching the maintenance cover 68. In this case, a transparent window enabling the visual check of the inside may be provided in part of the maintenance cover 68.

Further, a gas feeding system 76 is provided in order to return, to the atmospheric pressure, the inside of a gap 74 (see FIG. 2) which is formed between the maintenance cover 68 and the seated valve element unit 52 when the valve element unit 52 is seated on the seating surface around the maintenance port 62. Concretely, as shown in FIG. 2, the gas feeding system 76 has: a flow path 78 which is provided on a defining wall defining the maintenance port 62 and through which the gap 74 communicates with the outside; and an opening/closing valve 86 provided in the flow path 78, and thus the gas feeding system 76 is capable of supplying $N_2$ gas, purified air, or the like when necessary.

Further, as shown in FIG. 2, a gap vacuum exhaust system 82 for evacuating the inside of the gap 74 is provided. This gap vacuum exhaust system 82 has: a flow path 84 which is provided in the defining wall defining the maintenance port 62 and through which the gap 74 communicates with the outside; and an opening/closing valve 86 provided in the flow path 84, and thus the gap vacuum exhaust system 82 is capable of exhausting the atmosphere in the gap 74 to vacuum when necessary.

Next, the operation of the gate valve apparatuses 20A, 20B, 20C, 20D of this embodiment will be described.

Figure 8:
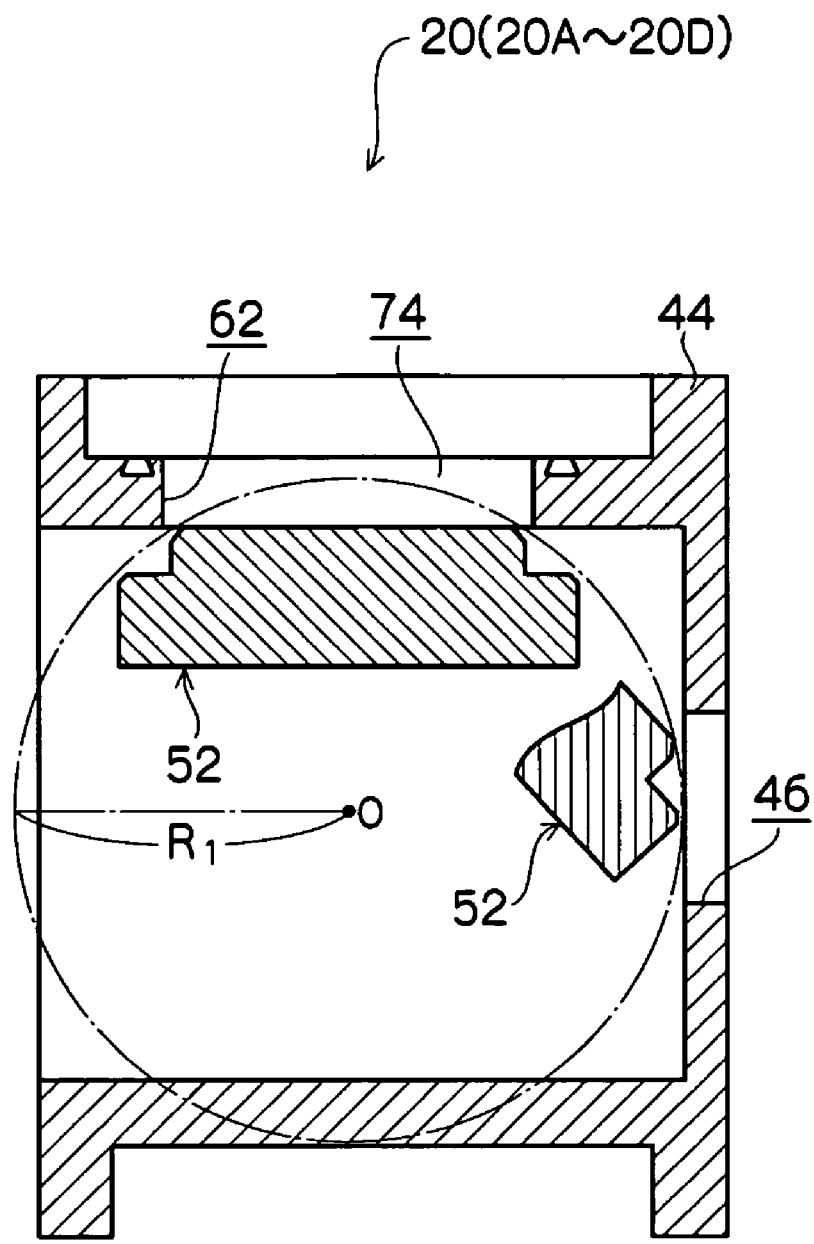
FIG. 8 is a cross-sectional view taken along A in FIG. 7, showing rotary driving of the valve element unit included in the gate valve apparatus according to the first embodiment of the present invention.
Figure 9:
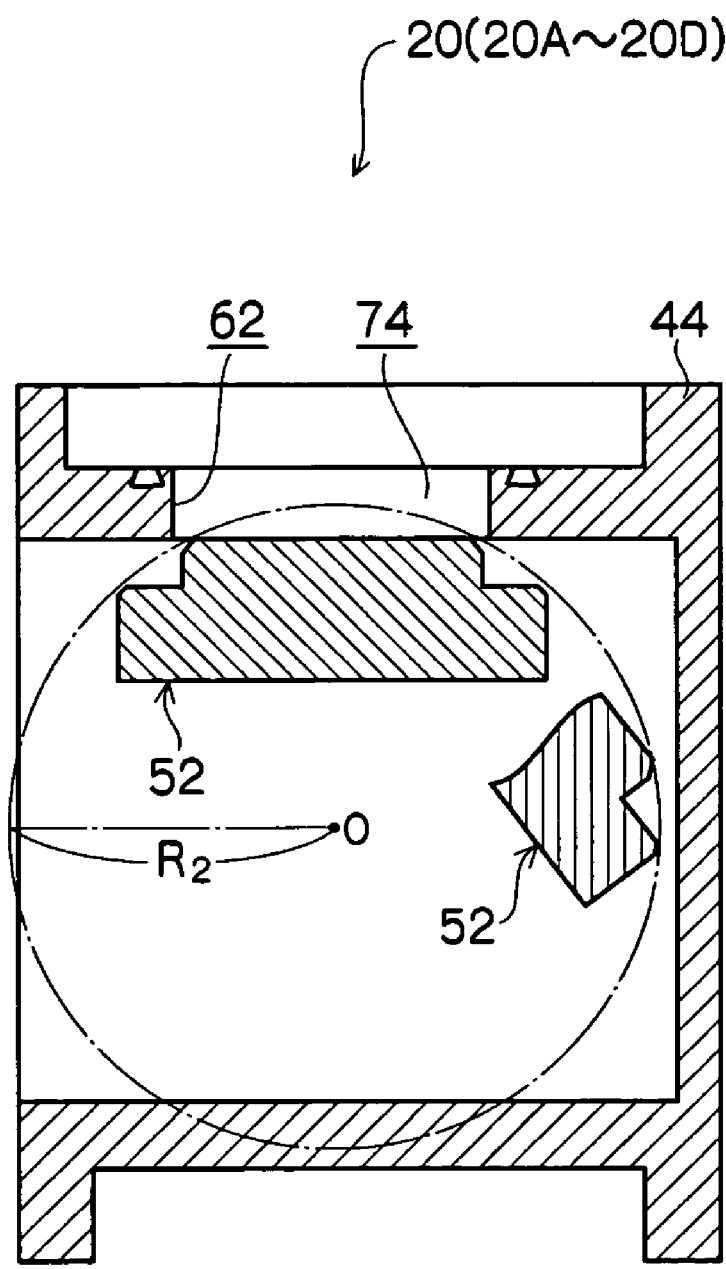
FIG. 9 is a cross-sectional view taken along B in FIG. 7, showing rotary driving of the valve element unit included in the gate valve apparatus according to the first embodiment of the present invention.

As shown in FIG. 2, FIG. 8, and FIG. 9, during the maintenance of the valve element sealing part 58, the second valve element 57 is seated on the seating surface of the maintenance port 62 to bring the maintenance port 62 into a closed state. In this state, since the maintenance port 62 is airtightly sealed by the maintenance sealing part 60 provided in the second valve element 57, the inside of the casing 44 is shut off from the outside. Then, after the inside of the gap 74 is returned to the atmospheric pressure by the gas feeding system 76 for returning the inside of the gap 74 to the atmospheric pressure, the maintenance cover 68 is opened, and the valve element sealing part 58 exposed to the outside from the maintenance port 62 is replaced with a new one, whereby the maintenance is finished.

After the maintenance is finished, the inside of the gap 74 is evacuated by the gap vacuum exhaust system 82 for evacuating the inside of the gap 74 so as to prevent the atmosphere from entering the process chambers 12A, 12B, 12C, 12D, and thereafter, the valve element unit 52 is rotary driven around the predetermined rotation axis by the valve element driving mechanisms 54, and the first valve element 56 of the valve element unit 52 is seated on the seating surface of the transfer port 46 to close the transfer port 46.

Here, the longitudinal both ends of the transfer port 46 are formed in the arc shape and the first valve element 56 seated on the seating surface of the transfer port 46 is formed substantially in the same shape as the shape of the transfer port 46; therefore, the longitudinal both ends of the first valve element 56 are naturally in the arc shape as shown in FIG. 4, FIG. 5, and FIG. 7. In other words, a length X2, of the longitudinal both ends of the first valve element 56, in a direction perpendicular to a valve element sealing part longitudinal direction is shorter than a length X1, of a longitudinal center portion of the first valve element 56, in the direction perpendicular to the valve element sealing part longitudinal direction.

Further, as shown in FIG. 6, a length M2, of longitudinal both ends of the maintenance port 62, in a direction perpendicular to a maintenance port longitudinal direction is shorter than a length M1, of a longitudinal center portion of the maintenance port 62, in the direction perpendicular to the maintenance port longitudinal direction. Further, as shown in FIG. 5, the length Y2, of the longitudinal both ends of the second valve element 57, in the direction perpendicular to the longitudinal direction is shorter than the length Y1, of the longitudinal center portion of the second valve element 57, in the direction perpendicular to the longitudinal direction as shown in FIG. 5 since the second valve element 57 seated on the seating surface of the maintenance port 62 is formed substantially in the same shape as the shape of the maintenance port 62.

For these reasons, as shown in FIG. 8 and FIG. 9, when the valve element unit 52 is rotary driven by the valve element driving mechanisms 54, a rotary drive radius R2 of the longitudinal both end sides of the first valve element 56 becomes shorter than a rotary drive radius R1 of the longitudinal center side of the first valve element 56. Therefore, even when the sidewall is formed on a longitudinal outer side of the transfer port 46 of the casing 44, part of the valve element unit 52 does not come into contact (interfere) with the sidewall, which makes it possible to rotary drive the valve element unit 52 only by slightly moving the valve element unit 52 in the direction of the center of rotation, without greatly moving the valve element unit 52 in the direction of the center of rotation at the time of the rotary driving. As a result the casing 44 can be compact, so that the gate valve apparatuses 20A, 20B, 20C, 20D can have a compact and simple structure, which enables a reduction in manufacturing cost thereof.

In particular, since a movement amount of the valve element unit 52 in the direction of the center of rotation when the valve element unit 52 is rotary driven needs to be only small, the supports 54B and the expansion members 54 can be formed compact, realizing a compact and simple structure of the valve driving mechanisms 54 and a great reduction in manufacturing cost thereof.

Next, a gate valve apparatus according to a second embodiment of the present invention will be described with reference to the drawings. Structures that are the same as those of the gate valve apparatus according to the first embodiment of the present invention will be denoted by the same reference numerals and symbols as those used in the first embodiment, and description thereof will be omitted.

Figure 10:
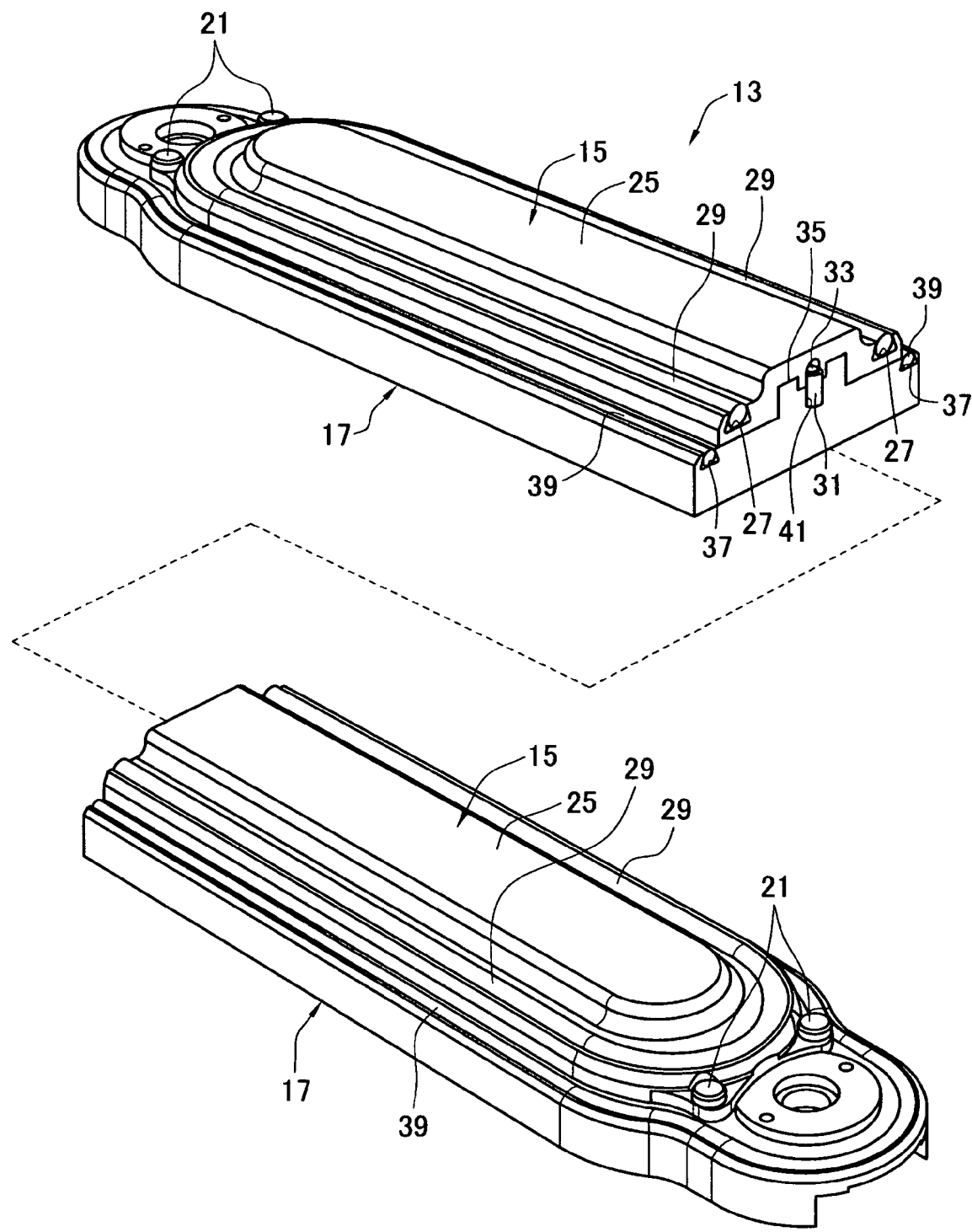
FIG. 10 is a perspective view showing a state where a valve element unit included in a gate valve apparatus according to a second embodiment of the present invention is cut along a longitudinal center portion.
Figure 11:
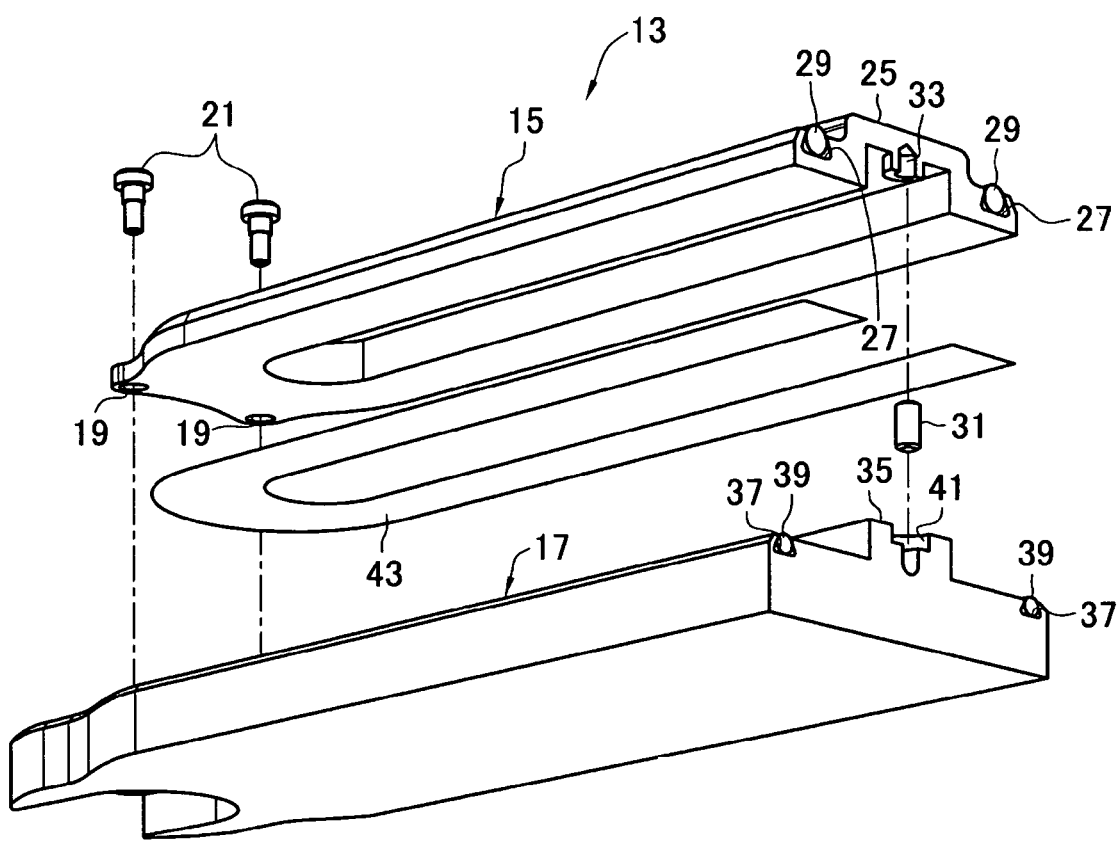
FIG. 11 is a partial exploded perspective view showing one longitudinal side of the valve element unit included in the gate valve apparatus according to the second embodiment of the present invention.
Figure 12:
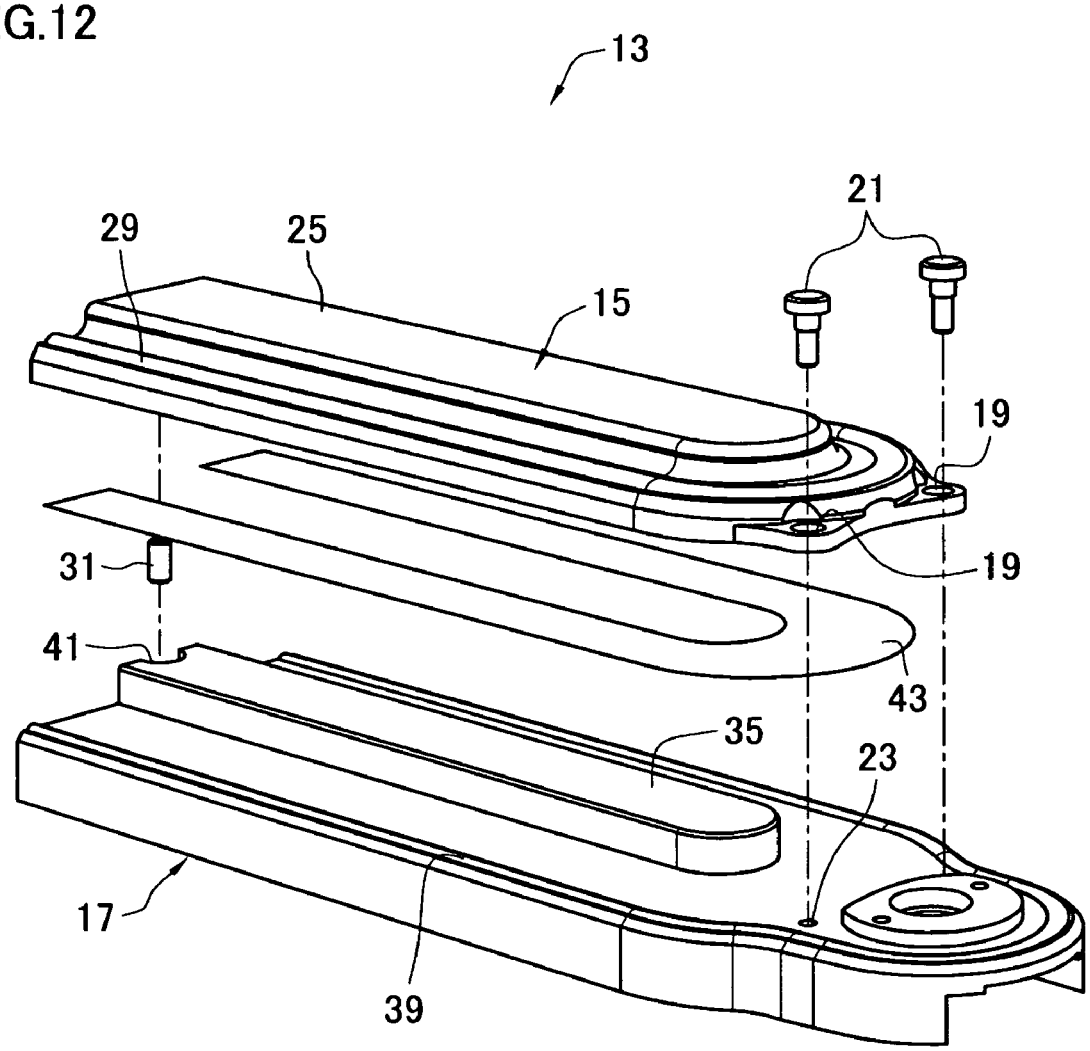
FIG. 12 is a partial exploded perspective view showing the other longitudinal side of the valve element unit included in the gate valve apparatus according to the second embodiment of the present invention.

As shown in FIG. 10 to FIG. 12, a valve element unit 13 of a gate valve apparatus 11 (see FIG. 13 and FIG. 14) according to the second embodiment is made up of a first valve element 15 made of metal (aluminum) and a second valve element 17 made of metal (aluminum) and formed larger than the first valve element 15 as described above, but the first valve element 15 is set so as to be separable from the second valve element 17 along a plane in a direction perpendicular to a thickness direction of the valve element unit 13.

Specifically, four through holes 19 are formed in longitudinal both ends of the first valve element 15. Valve fixing screws 21 are inserted in the through holes 19. The valve element fixing screws 21 inserted through the through holes 19 are screwed into threaded grooves 23 (see FIG. 12) of the second valve element 17 respectively, so that the first valve element 15 is fit on the second valve element 17. It is set that a later-described maintenance sealing part 39 is positioned on an outer side of an outer periphery of the first valve element 15 when the first valve element 15 is in the state of being fit on the second valve element 17.

In a center portion of a front surface of the first valve element 15, a first protrusion 25 is formed along the longitudinal direction. A backside of the first protrusion 25 is a hollow in which a later-described second protrusion 35 is inserted. In a periphery of the first valve element 15, a first sealing groove (groove) 27 (see FIG. 10 and FIG. 11) is formed outside a periphery of the first protrusion 25. The first sealing groove 27 is continuously formed along the whole periphery of the first valve element 15. A valve element sealing part (first sealing member) 29 is fit in the first sealing groove 27. Here, the valve element sealing part 29 is inlaid in the first sealing groove 27 without using a fixing tool such as an adhesive. Specifically, a separation distance between tips of both sidewalls of the first sealing groove 27 is set smaller than a diameter of the valve element sealing part 29, so that the valve element sealing part 29 is press-fit in the first sealing groove 27. In a state where the valve element sealing part 29 is inlaid in the first sealing groove 27, a certain pressure from the tips of the both sidewalls of the first sealing groove 27 works on the valve element sealing part 29. This makes it possible to surely mount the valve element sealing part 29 in the first sealing groove 27, thereby preventing the valve element sealing part 29 from accidentally coming off the first sealing groove 27. Further, a first positioning insertion hole 33 in which one end of a positioning pin (positioning member) 31 is inserted is formed in a center portion of a rear surface of the first valve element 15.

The second valve element 17 is mounted on the rear surface side of the first valve element 15. Near the longitudinal both ends of the second valve element 17, four threaded grooves 23 are formed. The valve element fixing screws 21 inserted through the through holes 19 of the first valve element 15 are screwed into the threaded grooves 23 respectively, whereby the first valve element 15 is assembled on the second valve element 17 and the integration of the both functions as the valve element unit.

Here, as the four valve element fixing screws 21, shoulder bolts not tightened up to a prescribed height or more are used. When the shoulder bolts are used as the four valve element fixing screws 21, the valve element fixing screws 21 are not completely tightened into the threaded grooves 23, so that a slight clearance is made between the first valve element 15 and the second valve element 17. Therefore, the clearance can absorb thermal expansion (thermal deformation amount) when the first valve element 15 is heated to be thermally expand (thermally deform), and thus no unnatural force works on a coupling (contact) portion between the first valve element 15 and the second valve element 17. As a result, a proper coupling (contact) state between the first valve element 15 and the second valve element 17 can be maintained without affected by the thermal expansion even when the first valve element 15 is heated.

In a center portion of a front surface of the second valve element 17, the second protrusion 35 is formed along the longitudinal direction. The second protrusion 35 is inserted in the rear surface side of the first protrusion 25 of the first valve element 15 when the first valve element 15 is mounted on the second valve element 17. The second protrusion 35 is formed for increasing rigidity of the valve element unit in order to prevent the valve element unit 13 from being warped by a sealing reactive force. Therefore, when the valve element unit 13 is pressed toward the valve seat face, a compression amount of the valve element sealing part 29 and the maintenance sealing part 39 becomes uniform in the entire area, so that these sealing parts 29, 39 are capable of exhibiting stable high sealability.

Further, in a periphery of the second valve element 17, a second sealing groove 37 (see FIG. 10 and FIG. 11) is formed on an outer side of a periphery of the second protrusion 35. The second sealing groove 37 is continuously formed along the whole periphery of the second valve element 17. A maintenance sealing part (second sealing member) 39 is fit in the second sealing groove 37. That is, a separation distance between tips of both sidewalls of the second sealing groove 37 is set smaller than a diameter of the maintenance sealing part 39, so that the maintenance sealing part 39 is press-fit in the second sealing groove 37. In a state where the maintenance sealing part 39 is inlaid in the second sealing groove 37, a certain pressure from the tips of the both sidewalls of the second sealing groove 37 works on the maintenance sealing part 39. This makes it possible to surely mount the maintenance sealing part 39 in the second sealing groove 37 and thus prevents the maintenance sealing part 39 from accidentally coming off the second sealing groove 37.

It should be noted that the structure where the valve element sealing part 29 and the maintenance sealing part 39 are press-fit in the first sealing groove 27 and the second sealing groove 37 is not restrictive, but another alternative may be, for example, to form U-shaped grooves in a U shape in the first valve element 15 and the second valve element 17 or form one-sided grooves (not shown) cut in a L shape in the peripheries of the valve elements and bond the valve element sealing part 29 and the maintenance sealing part 39 in the respective grooves by using an adhesive.

Further, in an center portion of a front surface side of the second protrusion of the second valve element 17, a second positioning insertion hole 41 in which the other end of the positioning pin 31 is inserted is formed. In a state where the other end of the positioning pin 31 is inserted in the second positioning insertion hole 41, the first valve element 15 is mounted on the second valve element 17 so that the one end of the positioning pin 31 is inserted in the first positioning insertion hole 33, whereby it is possible to position the first valve element 15 relative to the second valve element 17. By thus interposing the positioning pin 31 between the first valve element 15 and the second valve element 17 and mounting the first valve element 15 on the second valve element 17, with the positioning pin 31 being inserted in the positioning insertion holes 33, 41, it is possible to mount the first valve element 15 at a proper position of the second valve element 17 without fail.

On the front surface side of the second valve element 17, a buffer sheet (buffer member) 43 is set. Since the first valve element 15 is mounted on the second valve element 17 with the buffer sheet 43 being set on the front surface side of the second valve element 17, the buffer sheet 43 is constantly present between the first valve element 15 and the second valve element 17. Therefore, the first valve element 15 and the second valve element 17 are in contact with each other via the buffer sheet 43. The buffer sheet 43 is made of PTFE (polytetrafluoroethylene) or PI (polyimide) with a 50 µm thickness.

Figure 13:
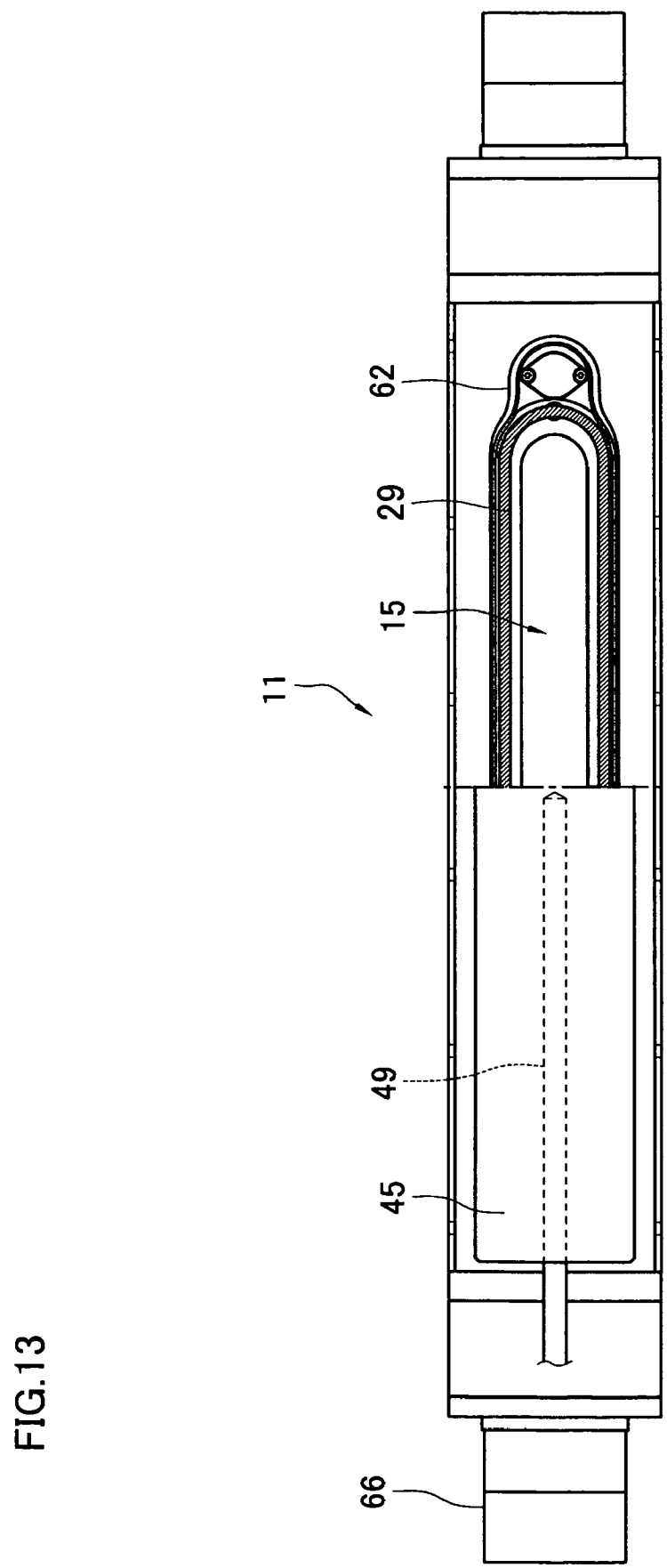
FIG. 13 is a plane view showing the gate valve apparatus according to the second embodiment seen from a second opening side.
Figure 14:
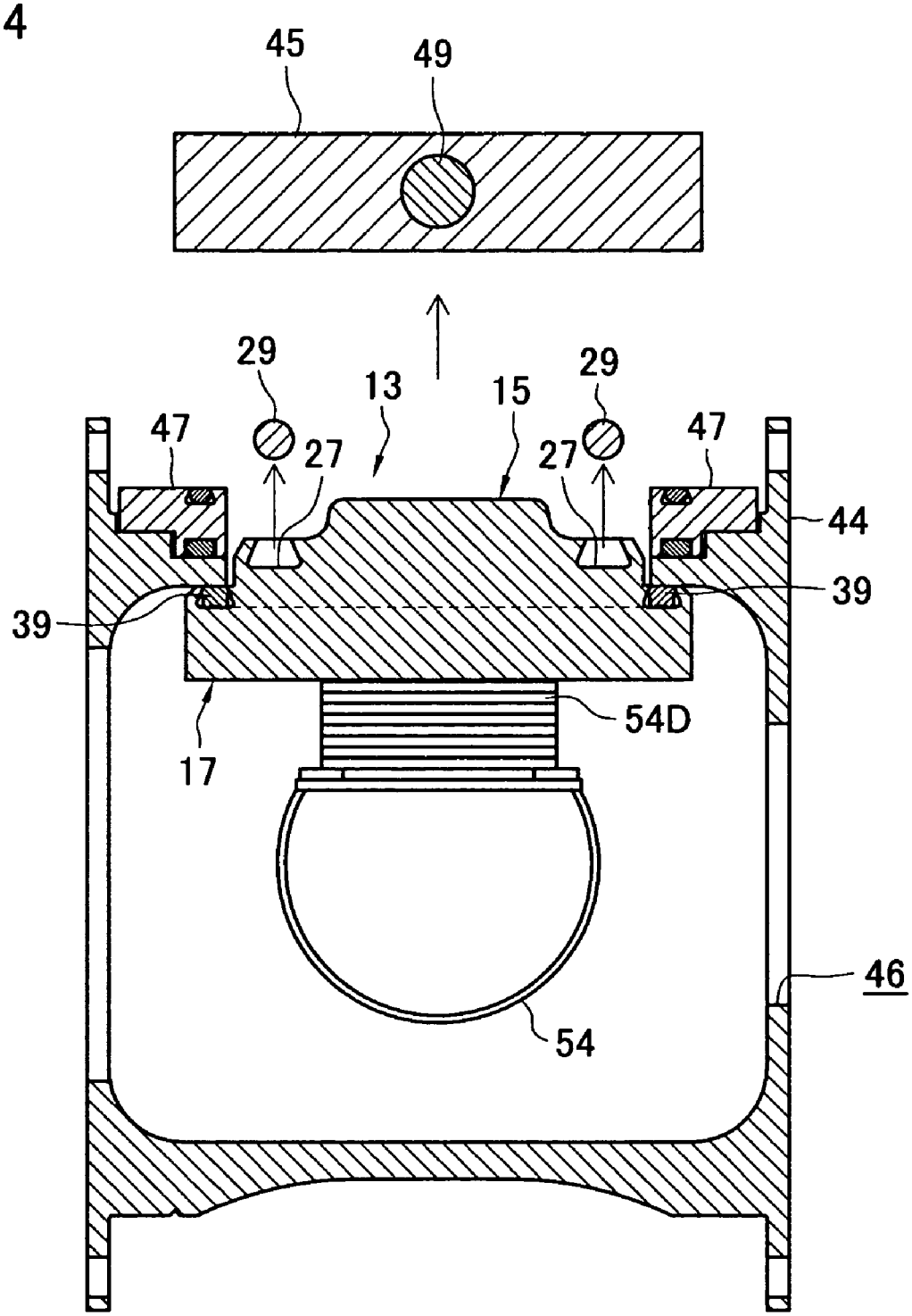
FIG. 14 is a view showing a state where the valve element unit included in the gate valve apparatus according to the second embodiment of the present invention closes the second opening (a state during the maintenance of a first sealing member)
Figure 15:
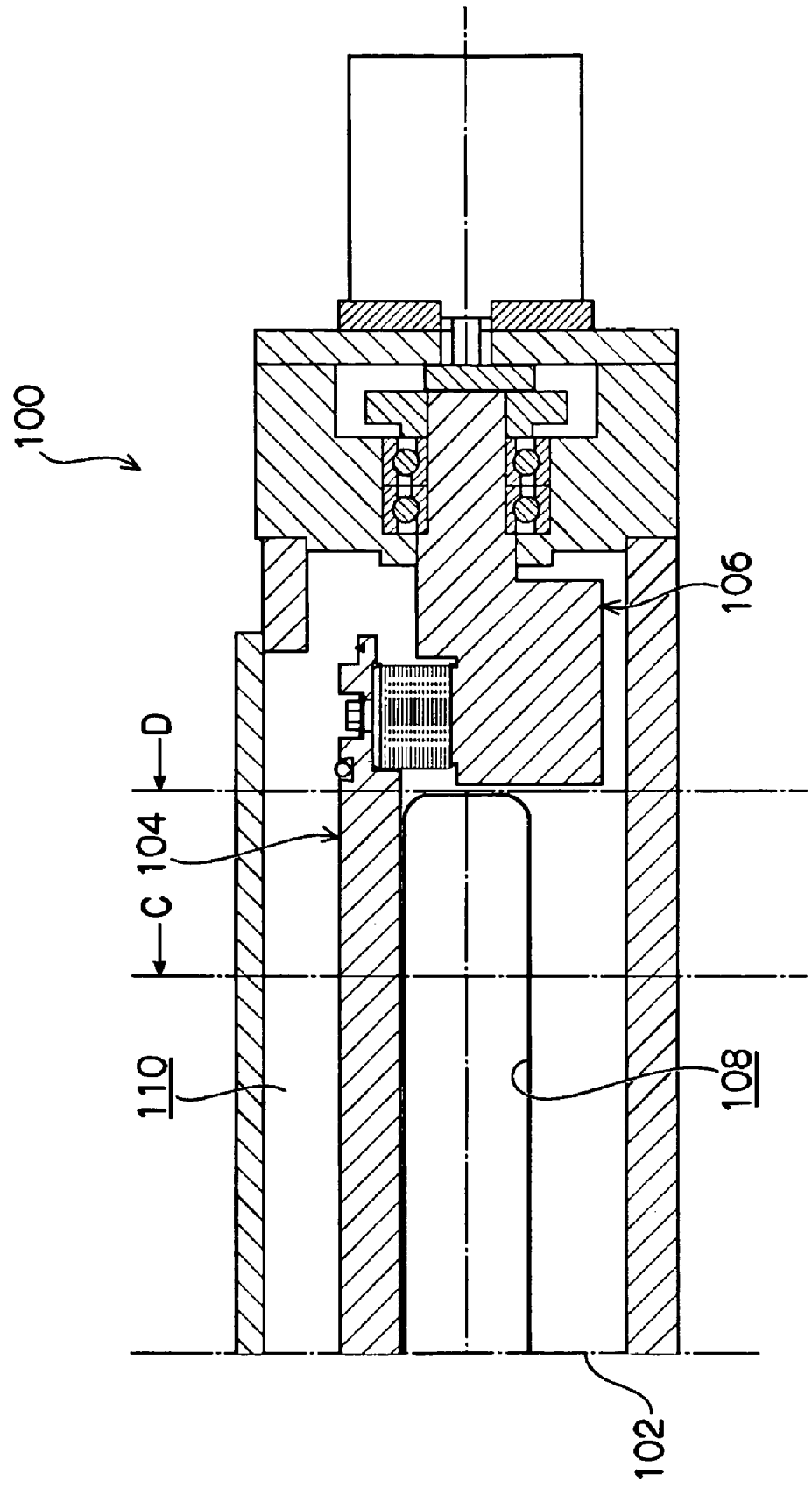
FIG. 15 is a partial cross-sectional view of a gate valve apparatus of a conventional art.
Figure 16:
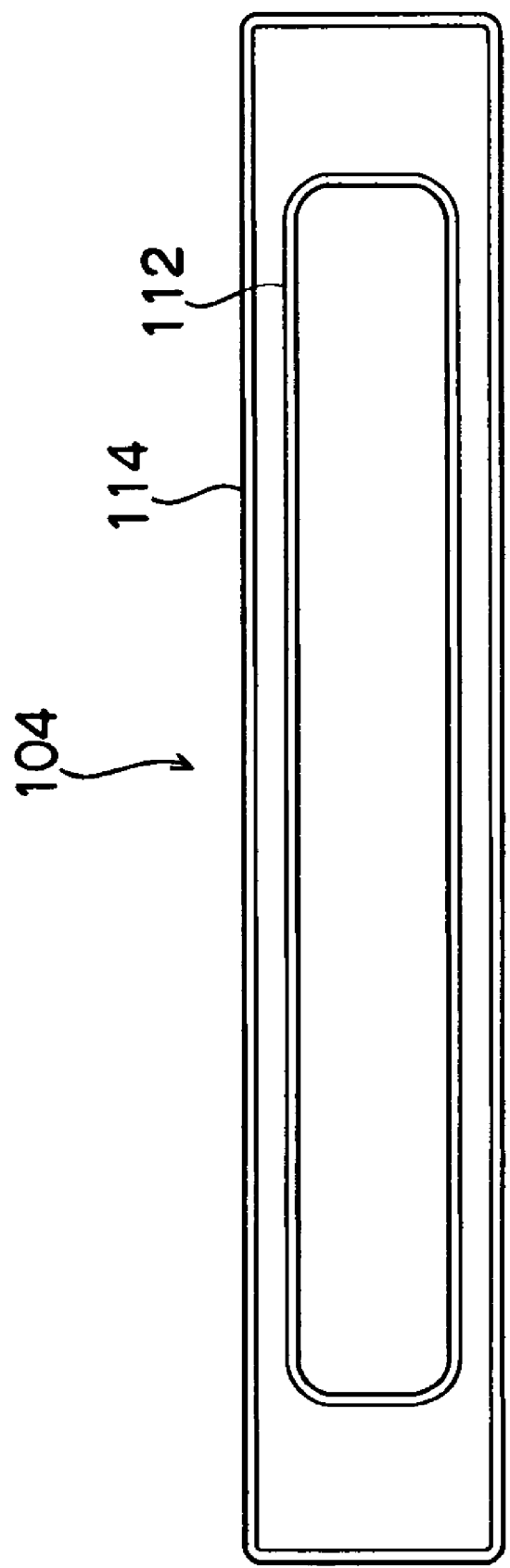
FIG. 16 is a front view of a valve element included in the gate valve apparatus of the conventional art.
Figure 17:
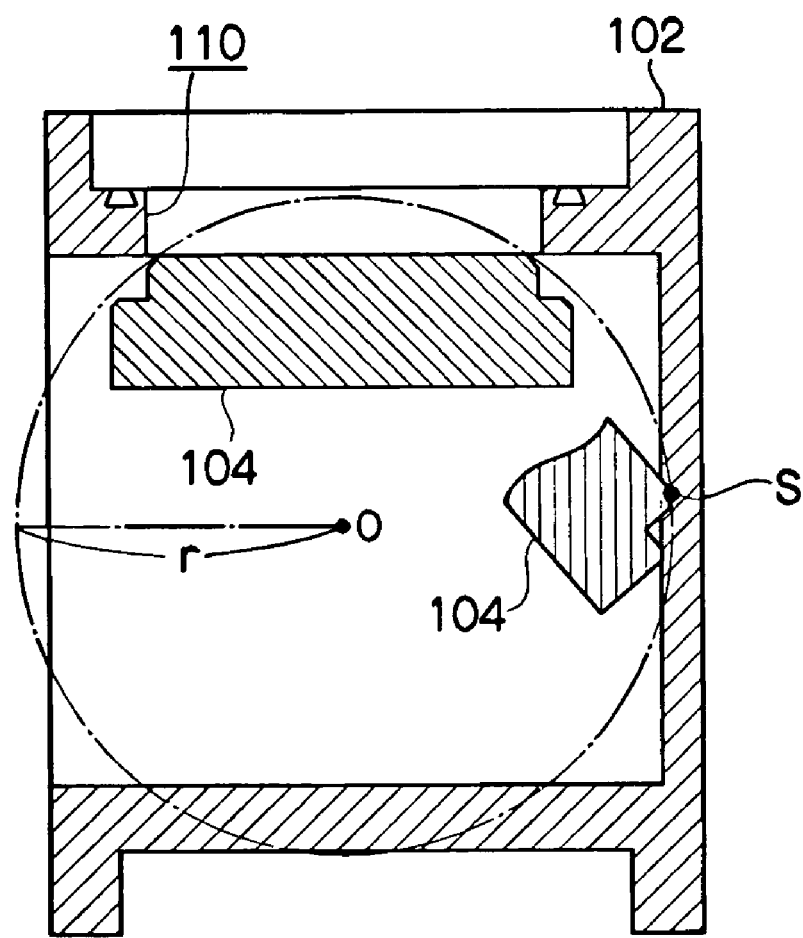
FIG. 17 is a cross-sectional view taken along D in FIG. 15, showing rotary driving of the valve element included in the gate valve apparatus of the conventional art.

Here, as shown in FIG. 13 and FIG. 14, a metal plate 45 is mounted on a maintenance port 62—side wall of a casing 44. That is, on the maintenance port 62—side wall of the casing 44, a mounting base 47 (see FIG. 14) made of metal is provided, and the metal plate 45 is mounted on the mounting base 47 by a fixing tool, not shown. The metal plate 45 is easily detachable from the mounting base 47 when the fixing by the fixing tool is released.

Further, the metal plate 45 has therein a cartridge heater 49 as a heating means. When the cartridge heater 49 is driven, the metal plate 45 is heated. When the metal plate 45 is heated, heat is transferred to the casing 44 via the mounting base 47. Therefore, it is possible to constantly regulate the temperature of the casing 44 to a fixed temperature. When the temperature of the casing 44 increases, the heat is conducted also to the first valve element 15 in contact with the casing 44 when the valve element 15 closes the first opening 46, resulting in an increase in temperature of the first valve element 15. Thus providing the cartridge heater 49 in the metal plate 45 and controlling the driving of the cartridge heater 49 by a not-shown controller, it is possible to control the temperature of the first valve element 15 as well.

Here, when heat is conducted to the first valve element 15 from the casing 44 or the process chamber 12 in the state where a first opening 46 is closed, the heat tries to be transferred from the first valve element 15 to the second valve element 17, but the buffer sheet 43 interposed between the first valve element 15 and the second valve element 17 blocks the movement of the heat from the first valve element 15 to the second valve element 17. As a result, since it is possible to inhibit the escape of the heat of the first valve element 15, the heat is accumulated concentratedly in the first valve element 15, enabling a concentrated temperature increase only of the first valve element 15.

As valve element driving mechanisms 54 driving the valve element unit 13 and other constituent members of the gate valve apparatus, those that are the same as the valve element driving mechanisms 54 and the constituent members of the gate valve apparatus of the first embodiment are used, and therefore description thereof will be omitted.

Next, the operation of the gate valve apparatus according to the second embodiment of the present invention will be described with reference to the drawings.

During the maintenance of the valve element sealing part 29, the second valve element 17 of the valve element unit 13 is seated on a seating surface of a maintenance port 62 to bring the maintenance port 62 into a closed state, as shown in FIG. 14. At this time, the maintenance port 62 is airtightly sealed by the maintenance sealing part 39 fit in the second valve element 17. Further, in the state where the maintenance port 62 is closed by the second valve element 17, the whole first valve element 15 is in a state of entering the inside of the maintenance port 62.

When the metal plate 45 is detached from the mounting base 47 when the whole first valve element 15 is in the state of entering the inside of the maintenance port 62, the whole first valve element 15 is exposed to the outside. Then, as shown in FIG. 11 and FIG. 12, the fixing by the valve element fixing screws 21 is released to detach the first valve element 15 from the second valve element 17. When the first valve element 15 is detached from the second valve element 17, the valve element sealing part 29 together with the first valve element 15 is also detached from the second valve element 17 since the valve element sealing part 29 is fit in the first valve element 15.

When the first valve element 15 is detached from the second valve element 17, a new first valve element 15 in which a new valve element sealing part without any damage or deterioration has already been fit is mounted on the second valve element 17. At this time, the other end of the positioning pin 31 is inserted in the second positioning insertion hole 41 of the second valve element 17, and therefore, by mounting the first valve element 15 on the second valve element 17 while positioning the first valve element 15 so that the one end of the positioning pin 31 is inserted in the first positioning insertion hole 33 of the first valve element 15, it is possible to position the first valve element 15 at the center position of the second valve element 17, which can enhance positioning accuracy of the mounting position of the first valve element 15 on the second valve element 17.

Then, the first valve element 15 is fixed by the valve element fixing screws 21, but since the shoulder bolts are used as the valve element fixing screws 21 as described above, the valve element fixing screws 21 are not completely tightened into the threaded grooves 23, and thus a slight clearance is made between the first valve element 15 and the second valve element 17. Therefore, when the first valve element 15 is heated to thermally expand (thermally deform), the thermal expansion (thermal deformation amount) can be absorbed by the clearance, which makes it possible to maintain a proper coupling (contact) state between the first valve element 15 and the second valve element 17 without affected by the thermal expansion.

Replacing the first valve element 15 with a new one at the time of the maintenance or replacement of the valve element sealing part 28 as described above makes a maintenance work or a replacement work easier than detaching the valve element sealing part 29 from the first valve element for the maintenance or replacement, and thus can increase work efficiency.

In particular, when the whole first valve element 15 is detached from the second valve element 17 at the time of the replacement of the valve element sealing part 29 and the first valve element 15 with the normally functioning valve element sealing part 29 fit therein is mounted on the second valve element 17, the first valve element 15 can be reused after the first valve element 15 is cleaned and a reaction product adhering to the first valve element 15 is removed, or can be replaced with the new first valve element. Therefore, the reaction product which may drop to cause the generation of particles can be removed from the first valve element 15 in advance, and thus it is possible to prevent the particles from entering the inside of the process chamber 12.

Further, as shown in FIG. 13 and FIG. 14, the metal plate 45 has the cartridge heater 49 therein, and therefore, due to heat conduction or heat emission (heat radiation) from the cartridge heater 49, heat is transferred to the metal plate 45, the mounting base 47, and the casing 44, and further from the casing 44 to the first valve element 15. Then, the heat tries to be transferred from the first valve element 15 to the second valve element 17, but since the buffer sheet 43 is interposed between the first valve element 15 and the second valve element 17, the buffer sheet 43 serves the function of blocking the heat conduction and thus prevents the heat conduction from the first valve element 15 to the second valve element 17. Consequently, the heat is accumulated concentratedly in the first valve element 15, which enables a concentrated temperature increase of the first valve element 15. Increasing the temperature of the first valve element 15 can prevent the reaction product of reaction gas from adhering to the first valve element 15. In other words, when the temperature of the first valve element 15 becomes low, the reaction product of the reaction gas easily adheres to the first valve element 15. If the reaction product of the reaction gas adheres to the first valve element 15, the reaction product drops from the first valve element 15 due to valve vibration or the like to cause the generation of the particles. The generation of the particles causes a problem of the contamination of the semiconductor wafer W in the process chamber 12. On the other hand, concentratedly increasing the temperature of the first valve element 15 makes it possible to prevent the reaction product, which may cause the generation of the particles, from adhering to the first valve element 15 and thus can prevent the particles from contaminating the semiconductor wafer W in the process chamber 12.

Owing to the buffer sheet 43 interposed between the first valve element 15 and the second valve element 17, it is possible to prevent the generation of metal powder and the like due to the friction between the first valve element 15 and the second valve element 17. As a result, dust which may cause the particles is prevented from being generated in the casing 44.

The invention claimed is:
1. A valve element unit provided in a casing having a first opening and a second opening for closing the first opening and the second opening,
   comprising:
   a first valve element for closing said first opening, said first valve element being formed in a shape elongated in a longitudinal direction thereof, said first valve element including an arc shape portion at both end portions thereof in the longitudinal direction;
   a second valve element for closing said second opening, said second valve element being formed in a shape elongated in the longitudinal direction, said second valve element including a middle portion between both end portions thereof and a contracted arc shape portion at the both end portions in the longitudinal direction, said contracted arc shape portion having a width in a direction perpendicular to the longitudinal direction smaller than that of the middle portion in a direction perpendicular to the longitudinal direction;
   a first sealing member fit to the first valve element for airtightly sealing said first opening; and
   a second sealing member fit to the second valve element for airtightly sealing said second opening.

2. The valve element unit according to claim 1, wherein:
said first valve element is separable from said second valve element along a plane in a direction perpendicular to a thickness direction of the valve element unit; and
said first valve element is attachable/detachable to/from said second valve element when said second valve element is in a state of closing said second opening.

3. The valve element unit according to claim 2, further comprising a buffer member provided between said first valve element and said second valve element.

4. The valve element unit according to claim 2, further comprising a positioning member provided between said first valve element and said second valve element to position said first valve element relative to said second valve element.

5. A gate valve apparatus comprising:
the valve element unit according to claim 1; and
a valve element driving unit rotary driving said valve element unit around a predetermined rotation axis.

6. A gate valve apparatus comprising:
a casing having a first opening and a second opening, said first opening being formed in a shape elongated in a longitudinal direction thereof, said second opening including a middle portion between both end portions thereof and a contracted arc shape portion at the both end portions in the longitudinal direction, said contracted arc shape portion having a width in a direction perpendicular to the longitudinal direction smaller than that of the middle portion in a direction perpendicular to the longitudinal direction;
a valve element unit having a first valve element for closing the first opening and a second valve element for closing the second opening, said first valve element being formed in a shape similar to that of the first opening, said second valve element being formed in a shape similar to that of the second opening; and
a valve element driving unit for rotating the valve element unit around a rotation axis.

7. The gate valve apparatus according to claim 6, wherein said casing has the first opening having a length greater than that of the second opening in the longitudinal direction.

* * * * *